(12) United States Patent
Stoltz et al.

(10) Patent No.: US 7,279,109 B2
(45) Date of Patent: *Oct. 9, 2007

(54) METHOD FOR MANUFACTURING A PHOTONIC DEVICE AND A PHOTONIC DEVICE

(75) Inventors: Björn Stoltz, Stockholm (SE); Eskil Bendz, Stockholm (SE)

(73) Assignee: Finisar Corporation, Sunnyvale, CA (US)

( * ) Notice: Subject to any disclaimer, the term of this patent is extended or adjusted under 35 U.S.C. 154(b) by 67 days.

This patent is subject to a terminal disclaimer.

(21) Appl. No.: 10/506,562

(22) PCT Filed: Mar. 7, 2003

(86) PCT No.: PCT/SE03/00388

§ 371 (c)(1),
(2), (4) Date: Apr. 29, 2005

(87) PCT Pub. No.: WO03/077388

PCT Pub. Date: Sep. 18, 2003

(65) Prior Publication Data

US 2005/0202679 A1    Sep. 15, 2005

(30) Foreign Application Priority Data

Mar. 13, 2002 (SE) .................................. 0200751

(51) Int. Cl.
*B29D 11/00* (2006.01)
*H01L 21/00* (2006.01)
(52) U.S. Cl. ............................ 216/24; 216/41; 216/58; 438/694; 385/129

(58) Field of Classification Search .................. 216/24, 216/41, 58; 438/694; 385/129
See application file for complete search history.

(56) References Cited

U.S. PATENT DOCUMENTS 5,250,462 A * 10/1993 Sasaki et al. .................. 438/24

(Continued)

FOREIGN PATENT DOCUMENTS

WO    WO99/39413    8/1999

(Continued)

OTHER PUBLICATIONS

Koji Nakamura et al., "Buried Heterostructure DFB Laser Integrated with Ridge Waveguide Electroabsorption Modulator with Over 20 GH$_z$ Bandwidth", IEEE, 1997, pp. 175-178.

(Continued)

*Primary Examiner*—Shamim Ahmed
(74) *Attorney, Agent, or Firm*—Workman Nydegger

(57) ABSTRACT

The present invention relates to a photonic device including a first device comprising a first set of layers, including at least a first waveguide layer, arranged in a mesa structure, and a second set of layers, including at least a second waveguide layer, formed in a second device region coupled to said first device in a light transmission direction. A cladding layer is arranged on top of the mesa structure, the second device region and the surrounding semiconductor material. A contact layer is arranged on top of the cladding layer, and a first and a second metal contact is arranged on top of the contact layer. The first set of layers, the cladding and contact layers are shaped in etching processes to remove adjacent arranged material. An insulating material is applied around the not etched cladding and contact layer. The invention also relates to a manufacturing method.

23 Claims, 7 Drawing Sheets

U.S. PATENT DOCUMENTS

| 6,226,310 B1* | 5/2001 | Takagi et al. ............ 372/50.11 |
| 2002/0064201 A1* | 5/2002 | Matsumoto .................. 372/50 |
| 2005/0213911 A1* | 9/2005 | Stoltz et la. ................ 385/129 |

FOREIGN PATENT DOCUMENTS

WO  WO 01/13479 A1  2/2001

OTHER PUBLICATIONS

Hiroyuki Kamioka et al., "Reliability of an electro-absorption modulator integrated with a distribute feedback laser", IEEE, 1999, pp. 1202-1203.

Masahiro Aoki et al., "InP-Based Reversed-Mesa Ridge-Waveguide Structure for High-Performance Long-Wavelength Laser Diodes", IEEE, 1997, vol. 3, No. 2, pp. 672-683.

Hiroaki Takeuchi et al., "NRZ Operation at 40 Gb/s of a compact Module Containing an MQW Electroabsoprtion Modulator Integrated with a DFB Laser", IEEE, 1997, vol. 9, No. 5, pp. 572-574.

* cited by examiner

METHOD FOR MANUFACTURING A PHOTONIC DEVICE AND A PHOTONIC DEVICE

TECHNICAL FIELD

The present invention relates to a method for manufacturing a photonic device, more specifically an active photonic device, such as a laser, optically connected to a passive photonic device, such as a modulator, as defined by the preamble of claim 1. The invention also relates to a photonic device as defined by the preamble of claim 14.

BACKGROUND TO THE INVENTION

Fiber optical communications uses light confined in an optical fiber for transferring information over long distances. For high speed transmission over long distances, an important light source for fiber optical communication is the Distributed Feed-Back laser (DFB-laser).

Two major types of DFB-lasers exist: Buried Heterostructure (BH) and Ridge. These two types are briefly described in connection with FIGS. 1a and 1b. Both have their advantages, e.g. the BH in general gives better performance and the Ridge is simpler to manufacture.

Even better performance may be obtained by adding a modulator to the DFB laser, e.g. an integrated Electro Absorption modulator (DFB-EA), since it introduces less chirp than direct modulation of the laser.

The DFB-EA component is made of a laser (DFB) and a modulator (EA) The device may be manufactured in many different ways and a popular way is to first epitaxially grow the laser material, then etch away all material not needed for the laser part and regrow new material around the laser (Butt Joint) to use for the modulator. Then a Ridge DFB-EA could be made if a contact layer is grown on top of the laser and the modulator material followed by etching the ridge.

This way to manufacture the DFB-EA device would introduce problems with current leakage/recombination in the butt jointed rim around the material forming the laser part due to defects at the interface and only slightly higher bandgap in the surrounding regrown material forming the modulator part. This causes high threshold currents. A typical value for the bandgap energy for the laser material is 0.80 eV and for the modulator material 0.83 eV. It is generally difficult to control the composition and quality of the modulator material close to the laser material due to diffusion of material from the masked region, so called SAG—Selected Area Growth.

These issues may be taken care of by manufacturing a BH DFB-EA laser instead. In this case a narrow mesa (waveguide) is etched down and semi-insulating (SI) InP is regrown around the laser and the modulator waveguide (see FIG. 1a), thus forcing all current to run through the component. The etching may also be done in front of the modulator, hence the regrown SI-InP will create a window some 15-30 μm adjacent to where the device finally will be cleaved. The window is used to suppress the light reflected by the cleaved facet of the chip back into the laser. This is achieved by spreading the light leaving the modulator waveguide material before it is reflected from the cleaved facet (see FIG. 2). The window thus relaxes the requirements on the anti-reflective coating of the facet. However, this method of manufacture of a DFB-EA requires one or two extra epitaxial process steps and hence increases the complexity (and price) of the device. Also, it is well known that the regrowth of the current-blocking layer around the mesa in the BH-laser mate cause reliability problems.

Insulating materials, such as BCB (Benzocyclobutene), has been used in micro chip fabrication for a long time, e.g. see article by R. A. Kirchhoff, C. J. Carriere, K. J. Bruza, N. G. Rondan, and R. L. Sammler with the title "Benzocyclobutenes: A new class of high performance polymers" Science-Chemistry, Vol A28, Nos. 11 & 12, 1991, pp. 1079-1113. The material has been used in a variety of electronics applications ranging from conductive, metal-filled adhesives to high planarizing and insulating layers on silicon wafers.

SUMMARY OF THE INVENTION

The object of the invention is to provide a simplified method for manufacturing a first photonic device optically coupled to a second photonic device with a decreased current leakage/recombination in the rim around the material forming the first photonic device.

This object is achieved by the characterizing features of claim 1, and the characterizing features of claim 14.

An advantage with the present invention is that it is simpler to manufacture compared to an ordinary BH device, having the same or better performance, with a potential for high yield and low cost.

Another advantage is a higher reliability due to the simpler manufacturing process.

The invention is further described below in connection with the appended drawings, which are included as examples illustrating the invention.

DETAILED DESCRIPTION OF THE PREFERRED EMBODIMENTS

Figure 1A:
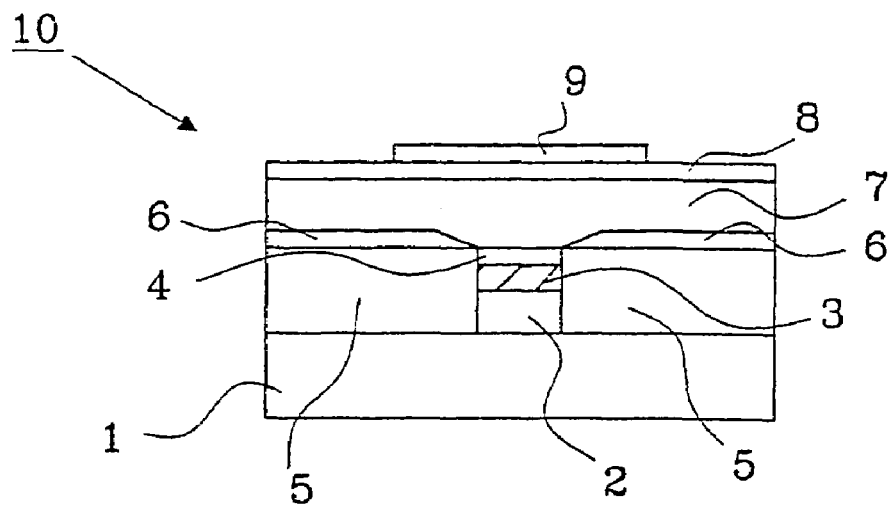
FIG. 1a shows a prior art Buried Heterostructure (BH) laser.
Figure 1B:
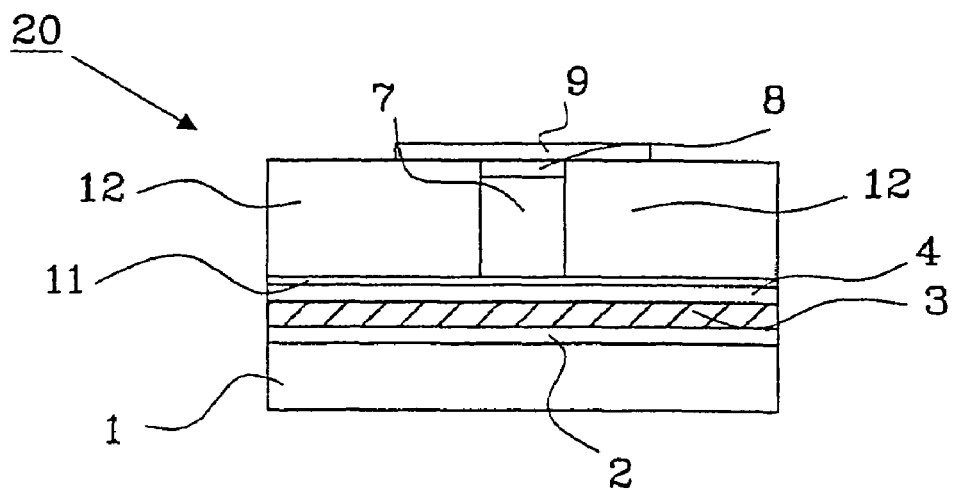
FIG. 1b shows a prior art ridge laser.

FIG. 1a and 1b have briefly been discussed in the background to the invention, where FIG. 1a shows a BH DFB laser and FIG. 1b shows a ridge DFB laser. These will now be described in more detail. In the case where the same reference numeral is used in different figures, it will indicate the same or a similar feature.

The buried heterostructure DFB laser 10 shown in FIG. 1a is manufactured on top of a semiconductor substrate 1. A set of layers including an epitaxial layer 2, a waveguide layer 3 and a protective layer 4 are thereafter grown on top of the substrate 1. The protective layer 4 may also include a grating with a protective coating arranged on top of the grating. The set of layers 2-4 is thereafter shaped into a waveguide mesa 20 having a predetermined width. The substrate is preferably InP and has a first type of dopant, e.g. n-type (n-InP). In this example, the epitaxial layer 2 is also n-InP, the waveguide layer is InGaAsP and the protective layer is p-InP.

A semi-insulating InP (SI-InP) layer 5 is arranged beside the waveguide mesa and an n-InP layer 6 is applied on top of the semi-insulating InP layer 5. A p-InP cladding layer 7 is thereafter arranged on top of the n-InP layer 6 and in contact with the protective layer 4. A p-InGaAs contact layer 8 is arranged on top of the cladding layer 7 and a metal contact 9 is arranged on top of the contact layer 8.

The ridge DFB laser 20 shown in FIG. 1b is manufactured on top of a semiconductor substrate 1. A set of layers including an epitaxial layer 2, a waveguide layer 3 and a protective layer 4 are thereafter grown on top of the substrate 1. The substrate is preferably InP and has a first type of dopant, e.g. n-type (n-InP). In this example, the epitaxial layer 2 is also n-InP, the waveguide layer is InGaAsP and the protective layer is p-InP.

An InGaAsP etch stop layer 11 is thereafter arranged on top of the protective layer 4 and a cladding layer 7 is grown on top of the etch stop layer 11. A contact layer 8 is grown on top of the cladding layer 7. The contact layer,8 and the cladding layer 7 are thereafter shaped into a ridge by an etch process, etching all the way down to the etch stop layer 11. An insulating material 12, such as a polymer, is thereafter spun on. A metal contact 9 which is in connection with the contact layer 8, is arranged on top of the laser.

Figure 2:
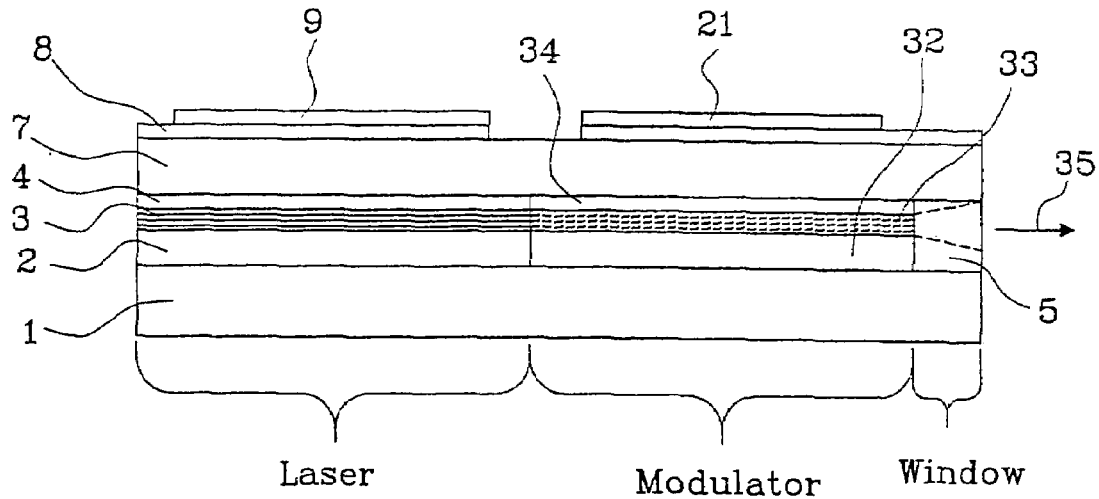
FIG. 2 shows a cross-sectional view of a BH DFB-EA device with a desired window region.

FIG. 2 shows a cross-sectional view of a BH DFB-EA with a desired window region, as previously described in background to the invention. The photonic device is manufactured on top of a semiconductor material 1, such as a substrate, which preferably is n-type InP. Two sets of layers constituting laser material 2-4, and modulator material 32-34, which are optically connected in a butt joint process as described in more detail in FIG. 4a-4d, are arranged on top of the substrate 1. The laser and modulator material is thereafter masked and unmasked material is etched down to the substrate 1, to achieve a waveguide mesa and to create a window region. A semi-insulating InP (SI-InP) layer 5 is arranged beside the waveguide mesa and in the window region. A cladding layer 7 and contact layer 8 is thereafter deposited as described in connection with FIG. 1. The contact layer 8 is divided into two parts, each part being separately arranged on top of laser and modulator. Thereafter is a laser contact 9 and a modulator contact 21 arranged on top of each part of the contact layer 8.

Figure 3:
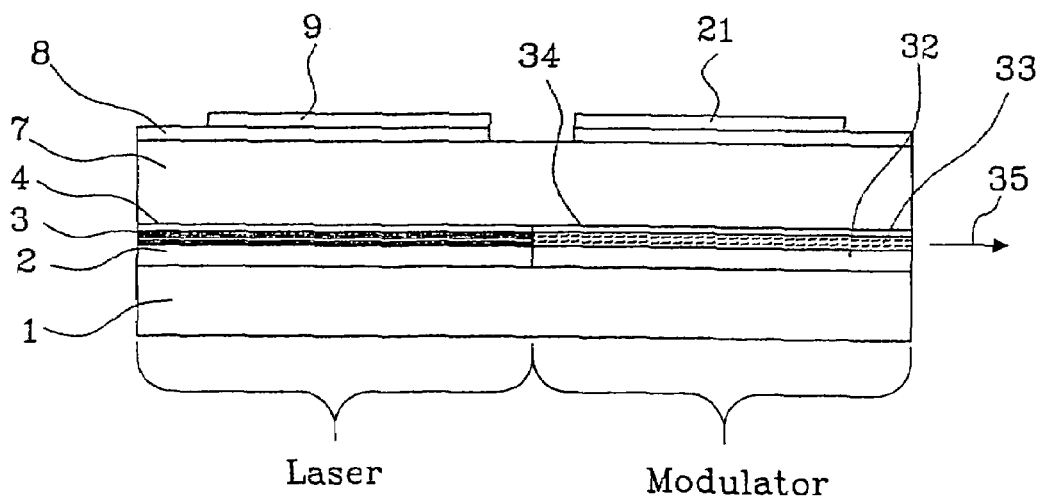
FIG. 3 shows a cross-sectional view of a ridge DFB-EA device without a window region.

FIG. 3 shows a cross-sectional view along a Ridge DFB-EA device. This embodiment does not have a window region. The photonic device is manufactured on a semiconductor material 1, such as an n-InP substrate. Two sets of layers constituting laser material 2-4, and modulator material 32-34, which are optically connected in a butt joint process as described in more detail in FIG. 4a-4d, are arranged on top of the substrate 1. A cladding layer 7 and a contact layer 8 is arranged on top of the two sets of layers 2-4, 32-34 and a ridge structure is shaped using a mask in an etch process. An insulating material 12, such as a polymer, is thereafter spun on. The contact layer 8 is divided into two parts, each part being separately arranged on top of laser and modulator. A laser contact 9 and a modulator contact 21 are arranged on top of each part of the contact layer 8.

The arrow 35 in FIG. 2 and 3 indicates the light transmission direction.

Figure 4B:
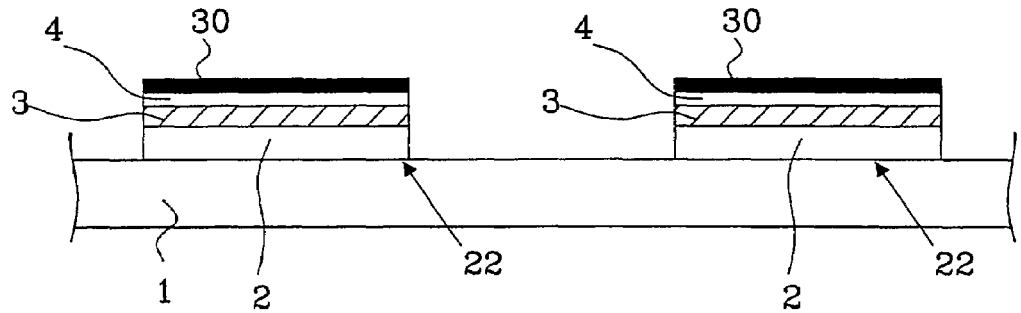
FIGS. 4a and 4b show a top view and a cross-sectional view, respectively, of a semiconductor wafer with an etched island mesa mask.
Figure 4A:
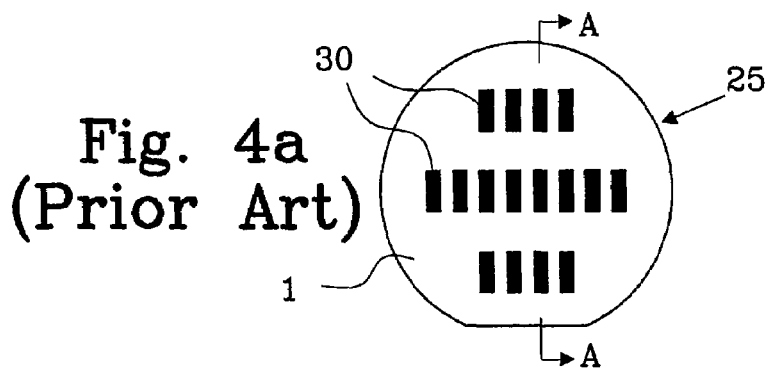
Figure 4D:
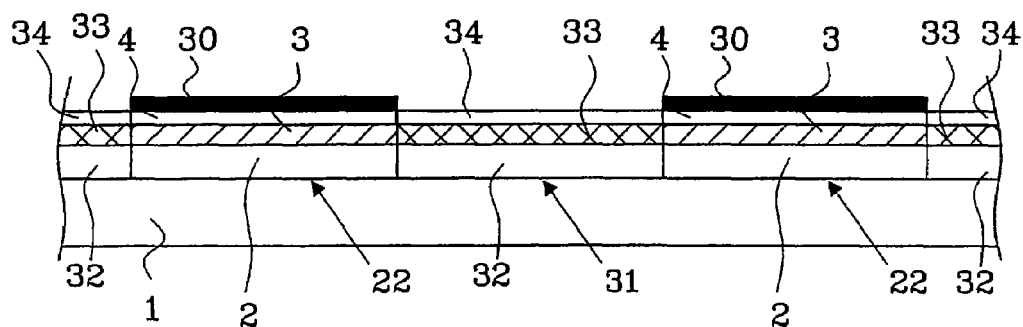
FIGS. 4c and 4d show a top view and a cross-sectional view, respectively, of a semiconductor wafer with regrown modulator material.
Figure 4C:
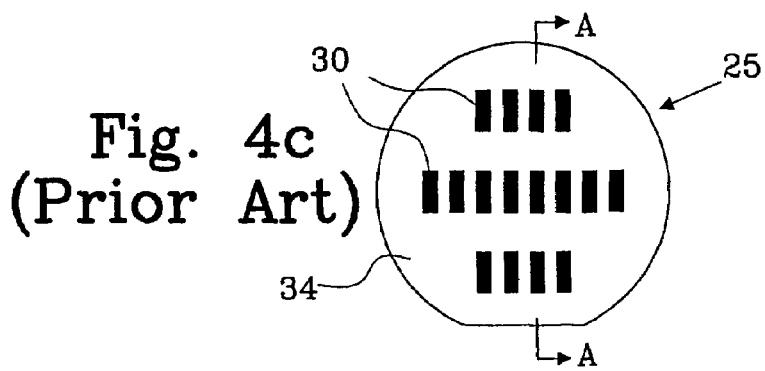

FIGS. 4a-4c illustrates how to optically connect two photonic devices to each other. This process is known as "Butt Joint".

FIG. 4a shows a top view of a semiconductor wafer 25, which has been provided with a first set of layers 22, comprising an epitaxially grown n-InP layer 2, a first waveguide layer 3 and a protective p-InP layer 4 grown on top of the substrate 1 and shaped into islands. The shaping is performed by applying an island mask 30 on top of the protective layer 4 and thereafter etching the unmasked layers down to the substrate 1 to obtain the shape shown in FIG. 4a. FIG. 4b shows a cross-sectional view along line A-A in FIG. 4a. The island mask 30 is preferably a nitride mask and is typically 10×500 μm.

FIG. 4c shows a top view of a semiconductor wafer 25, upon which a second set of layers 31, comprising an n-InP layer 32, a second waveguide layer 33 and a protective layer 34, has been grown. The second set of layers 31 (corresponding to modulator material) surrounds the first set of layers 22 (i.e. the laser material). FIG. 4d shows a cross-sectional view along line A-A in FIG. 4c.

This process of obtaining laser material optically connected to modulator material is called "Butt Joint", as mentioned above, and is widely used in photonic device manufacture. The island mask 30 is thereafter removed and the wafer with the islands of laser material surrounded with modulator material may be used for further processing.

Alternative methods for optically connecting the laser and modulator material that may be used to implement the present invention are SAG (Selective Area Growth), as is described in the published patent application WO 00/38284, and Quantum Well Intermixing (QWI) also known as Impurity Free Vacancy Disordering. QWI is a method where the complete wafer surface is covered by a single set of layers, including a waveguide layer. Island masks are applied to the surface, to protect the areas where the lasers are to be created, and a substance, e.g. quartz, is sputtered onto the exposed surface. The wafer is thereafter annealed, which will cause a mixing of the quantum wells and thus a change in the material into modulator material. This is well known for a skilled person in the art.

FIGS. 5a-5e show views of a process to manufacture a photonic device.

Figure 5A:
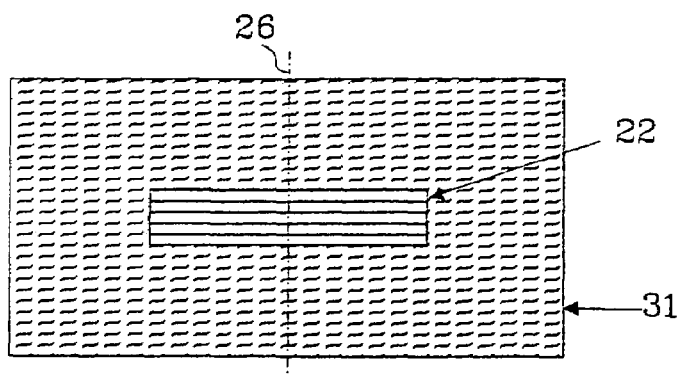
FIGS. 5a-5e show manufacturing steps for producing a photonic device according to the invention.

FIG. 5a shows a top view of a part of the semiconductor wafer 25 in FIG. 4c including the first set of layers 22 surrounded by the second set of layers 31. A line 26 indicates a position where the processed wafer is cleaved when completed.

Figure 5B:
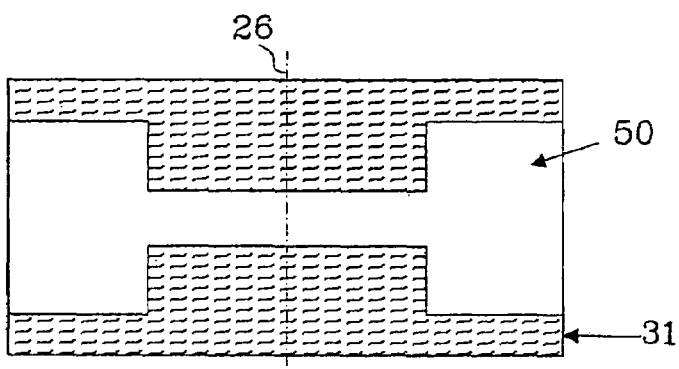
Figure 5C:
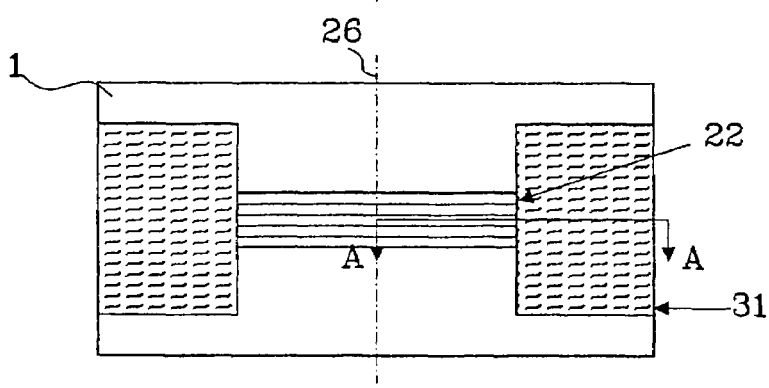

A first mask 50 is arranged on top of the two sets of layers 22 and 31, as shown in FIG. 5b. Unmasked areas are etched down to the substrate 1 and the first mask is removed, the result after this step is shown in FIG. 5c. The shape of the first mask makes it possible to remove all of the modulator material adjacent to the laser material not being in a light transmission direction thereof.

The first mask is determining the physical shape of the finished laser and modulator waveguide material. Other shapes of the first mask shown in FIG. 5b are of course possible, see FIG. 8a. The essential part of the first mask 50 is that it allows modulator material adjacent to the laser material to be removed by the following etch step.

Figure 5D:
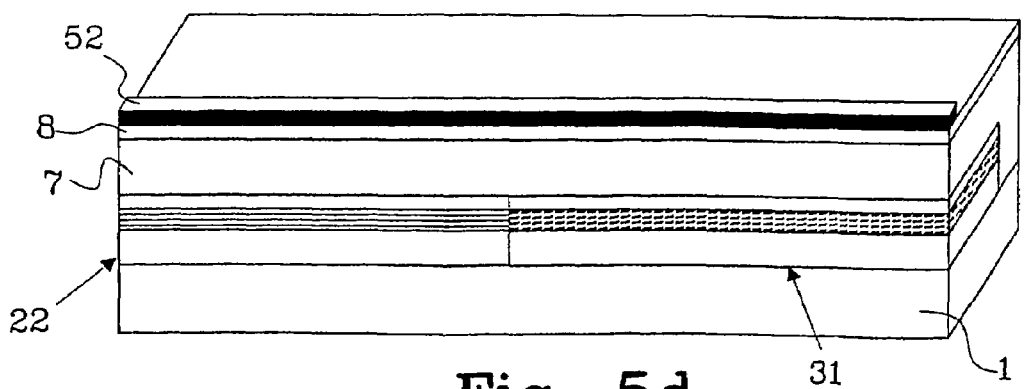

FIG. 5d is a cross-sectional perspective view taken along A-A in FIG. 5c showing the photonic device after growing a cladding layer 7 on top of the remaining sets of layers 22 and 31 and the exposed substrate 1, and a contact layer 8 on top of the cladding layer 7. A second mask 52 is arranged on top of the contact layer 8, directly above the first and second set of layers 22 and 31.

The contact layer 8 and a part of the cladding layer 7, in areas not masked with the second mask 52, are etched away. The etching may be performed with a dry etching process, such as RIE-etching, or a wet etching process, and the etching process is terminated when reaching the underlying first 22 and second 31 set of layers. The second mask 52 is removed and the contact layer is divided into two parts, each part being separately arranged on top of the first and second photonic device, respectively. An insulating material 53, such as a polymer, is thereafter spun on, thus creating a layer 54 of InP surrounding the active layers 22 and 31. Metal contacts 9 and 21 are arranged on top of each part of the contact layer 8. This is shown in the cross-sectional perspective view in FIG. 5e.

Figure 5E:
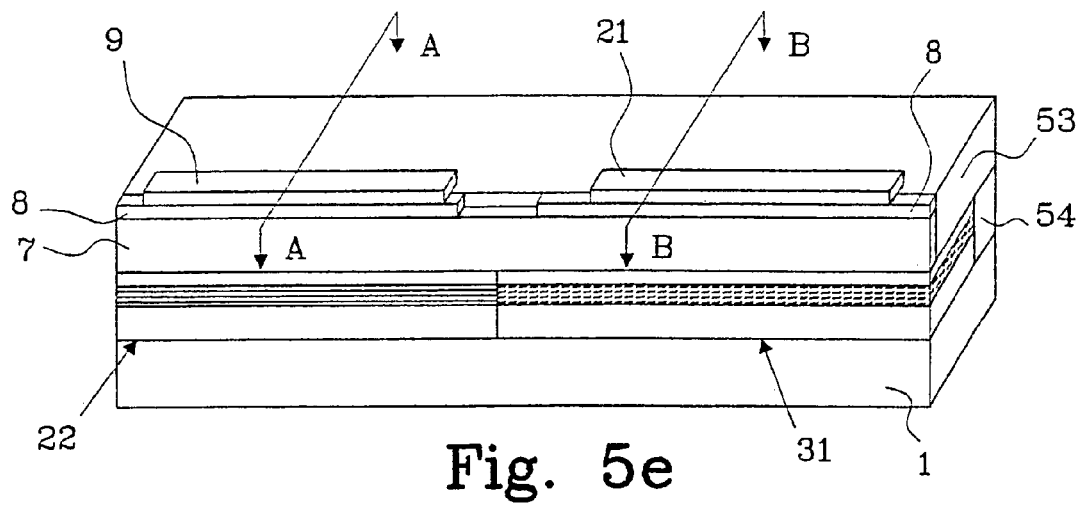
Figure 6A:
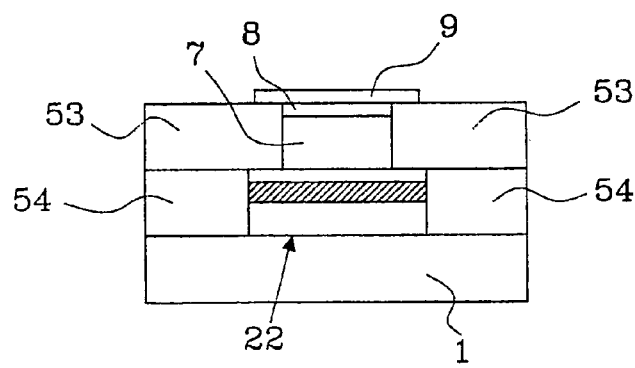
FIGS. 6a-6b show cross-sectional views of the manufactured device in FIG. 5e.
Figure 6B:
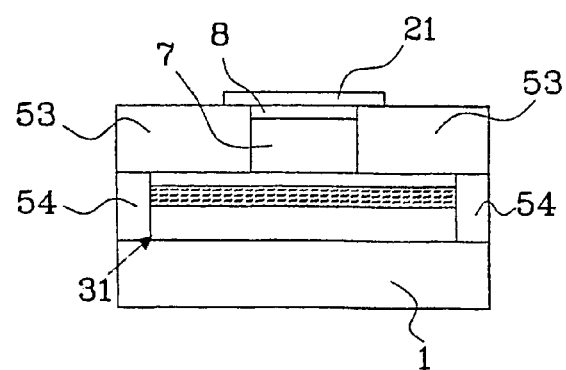

FIGS. 6a-6b show cross-sectional views of the laser and modulator of the photonic device shown in FIG. 5e.

FIG. 6a shows a cross-section of the laser of the photonic device along A-A in FIG. 5e. The cladding layer 7 and the contact layer 8 are surrounded by the insulating material 53. The first set of layers 22, which is arranged directly beneath the cladding layer 7, is surrounded by the created InP layer 54. The first set of layers 22 and the created InP layer 54 are arranged on a substrate 1.

FIG. 6b shows a cross-section of the modulator of the photonic device along B-B in FIG. 5e. The cladding layer 7 and the contact layer 8 are surrounded by the insulating material 53. The second set of layers 31, which is arranged below the cladding layer 7 and some of the insulating material 53, is surrounded by the created InP 54. The second set of layers 31 is arranged on the substrate 1.

Figure 7A:
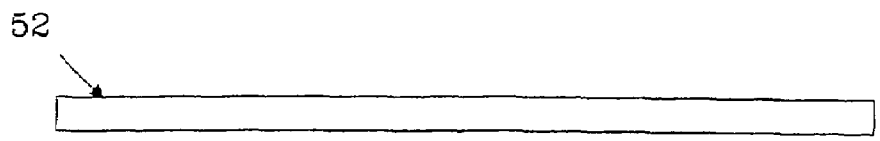
FIG. 7a shows the mask applied in FIG. 5d.

FIG. 7a shows the shape of the second mask 52 used in the manufacturing steps described in connection with FIG. 5d.

The second mask 52 has a rectangular shape covering all parts of the photonic device, i.e. laser and modulator.

Figure 7B:
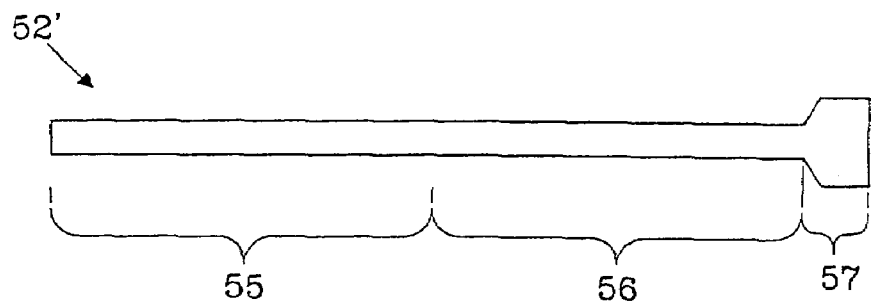
FIG. 7b shows an alternative mask that is applied in FIG. 9.
Figure 9:
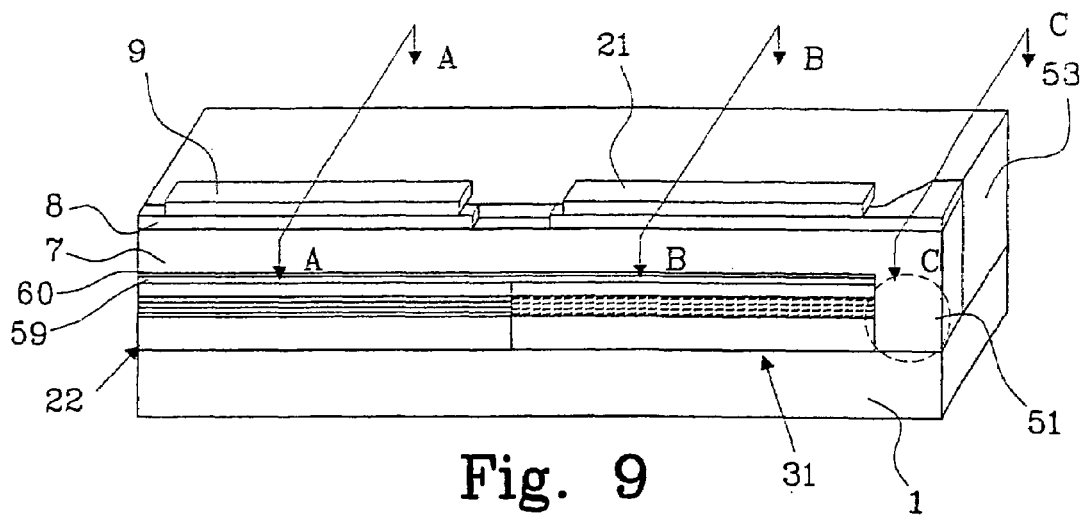
FIG. 9 shows a cross-sectional perspective view of a photonic device manufactured according to the alternative manufacturing steps in FIG. 8a and 8b.

FIG. 7b shows an alternative shape of a second mask 52', which is used in the alternative manufacturing steps resulting in the photonic device shown in FIG. 9. The essential difference between the shapes of the masks, for the invention as such, is the addition of a window masking portion 57. The window masking portion 57 of the alternative second mask 52' has a tapered shape that will improve the efficiency of a window region 51 by eliminating or at least reducing the reflections from the side walls of the mesa, allowing the use of a longer window region. The tapering should be done smoothly to avoid unwanted reflections into the waveguide.

Figure 8A:
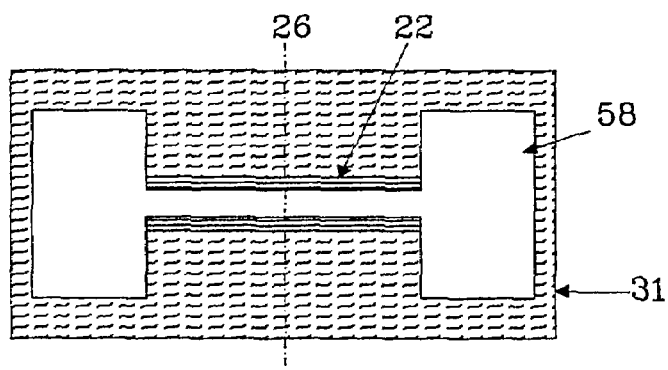
FIGS. 8a and 8b show alternative manufacturing steps for producing a photonic device according to the invention.

The width of the laser masking portion 55 may be different than the width of the modulator masking portion 56, but in this example they have the same width. When shaping the laser and the modulator material in the photonic device an alternative first mask 58 may be applied instead of mask 50 used in FIG. 5b. FIG. 8a shows the alternative first mask 58 arranged on top of the two sets of layers 22 and 31. The shape of the alternative first mask 58 makes it possible to create a window region 51 adjacent to the modulator in the light transmission direction thereof.

Figure 8B:
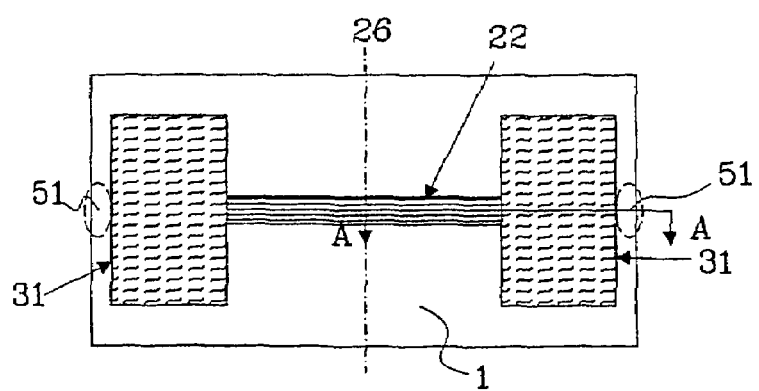

The unmasked areas are etched down to the substrate 1, and the first mask 58 is thereafter removed. The result of these manufacturing steps is shown in FIG. 8b. The laser material, i.e. the first set of layers 22, has only adjacently arranged modulator material, i.e. the second set of layers, in the light transmission direction of the photonic device. Modulator material and some of the laser material in areas adjacent to the laser in a non-light transmission direction have been removed during the etching step due to the shape of the alternative first mask 58. The reason for removing some of the laser material, at the same time as the modulator material is removed, is to remove any laser material that might have been damaged during earlier process steps. This will result in an improved performance of the photonic device.

The modulator material is also removed adjacent to the modulator region in the light transmission direction thereof. This allows a window region 51 to be created during the following steps of the manufacturing process.

A thin p-InP layer 59 is grown on top of the remaining sets of layers 22 and 31 and the exposed substrate 1 and an etch stop layer 60 is thereafter grown on top of the thin p-InP layer 59. A cladding layer 7 is thereafter grown, and a contact layer 8 is grown on top of the cladding layer 7. The alternative second mask 52' is arranged on top of the contact layer 8, directly above the first and second set of layers 22 and 31.

The contact layer 8 and the cladding layer 7, in areas not masked with the second mask 52', are etched away. The etching may be performed by a wet etching process, and the etching process is terminated when reaching the etch stop layer 60. An insulating material 53, such as a polymer, is thereafter spun on.

The second mask 52' is removed and the contact layer 8 is divided into two parts, each part being separately arranged on top of the first and second photonic device, respectively. Metal contacts 9 and 21 are arranged on top of each part of the contact layer 8. A window region 51 is thus formed by the same material that is used to create the cladding layer 7.

This is shown in the cross-sectional perspective view in FIG. 9.

The second mask 52 described in FIG. 7a, may naturally be used instead of the alternative second mask 52' applied in this embodiment. The wideness of the window region 51 would then be different.

Figure 10A:
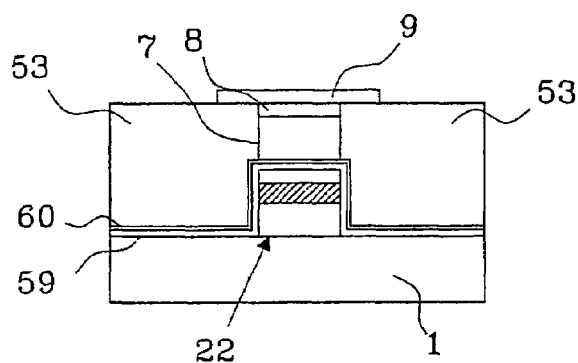
FIGS. 10a-10c show cross-sectional views of the manufactured device in FIG. 9.
Figure 10B:
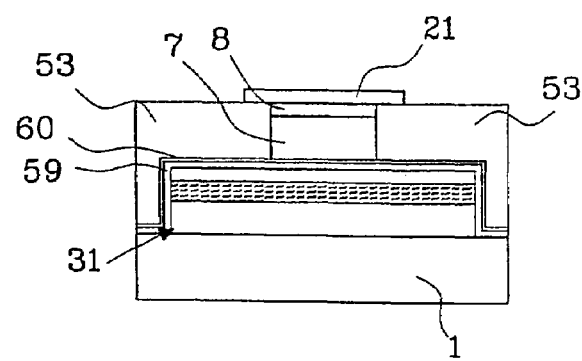
Figure 10C:
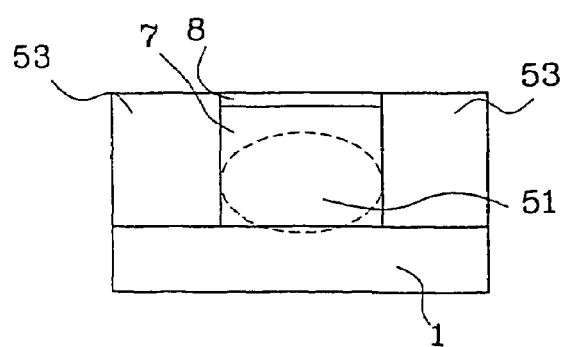

FIGS. 10a-10c show cross-sectional views of the laser, modulator and window region of the photonic device shown in FIG. 9.

FIG. 10a shows a cross-section of the laser of the photonic device along A-A in FIG. 9. The first set of layers 22 is, in this embodiment, shaped in a waveguide mesa that is covered by the thin layer 59 and the etch stop layer 60 that protect the waveguide mesa during the etch step. The waveguide mesa 22 is arranged on the substrate 1. The cladding layer 7 and the contact layer 8 are arranged on top of the etch stop layer 60 directly above the waveguide mesa 22. The width of the contact layer 7 and the waveguide mesa 22 is in this example equal, but the contact layer could be wider or narrower than the waveguide mesa 22 if desired. The waveguide mesa 22, the contact layer 7 and the contact layer 8 are surrounded by the insulating material 53.

FIG. 10b shows a cross-section of the modulator of the photonic device along B-B in FIG. 9. The cladding layer 7 and the contact layer 8 are surrounded by the insulating material 53. The second set of layers 31, which is arranged on the substrate 1, is covered by the thin layer 59 and the etch stop layer 60 and is surrounded by the insulating material 53. The etch stop layer 60 protects the modulator material during the etch step.

FIG. 10c shows a cross-section or the window region of the photonic device along C-C in FIG. 9. The cladding layer 7 and the contact layer 8 are surrounded by the insulating material 53. The cladding layer 7 stretches all the way from the substrate 1 to the contact layer 8. The position of the window region 51 is indicated by the dashed circle in FIG. 10c. A thin layer or etch stop layer may be present in the window portion 51, but is in this example omitted from the embodiment.

In all the different embodiments of the present invention, a substrate has been used upon which the photonic devices have been manufactured, but it is of course possible to manufacture the devices on top of an epitaxially grown layer on any type of substrate, such as a semi-insulating substrate. A <1,0,0>InP substrate is preferably used in the manufacturing of the present invention when wet etching is used to form the waveguide mesa 22 and during the shaping of the contact layer 8 and the cladding layer 7. The photonic devices must be directed in the direction to improve the etch profiles.

The second mask 52 and 52' applied in the manufacturing steps according to the invention is in all embodiments removed after the insulating material has been applied to the photonic device. However, this is not necessary. The second mask is preferably a metal mask, and more preferably made from Titanium, and may thus be used in the photonic device as metal contacts. In that case, a part of the second mask has to be removed not to separate the metal contacts provided to the laser and the modulator of the photonic device.

Another option is to keep the second mask and oxidize the second mask in certain areas to provide insulating properties. This will not be described in more detail since this is known to the skilled person in the art, and is not an essential part of the invention.

This process may also be used when manufacturing DBR lasers with or without an optically connected modulator (DBR-EA) or a device with an integrated amplifier or detector.

The invention claimed is:

1. A method for manufacturing a first photonic device optically connected to a second photonic device, comprising the steps:
   a) epitaxially growing a first set of layers, including at least a first waveguide layer, on a semiconductor material having a dopant of a first type,
   b) applying an island mask on top of the first set of layers and removing the first set of layers in the unmasked areas,
   c) epitaxially growing a second set of layers for the second photonic device, including at least a second waveguide layer, on the semiconductor material in the unmasked areas, and thereafter removing the island mask,
   d) applying a first mask on top of the grown layers, removing the first and the second sets of layers in the unmasked areas, to form at least said first photonic device in a mesa structure and a second photonic device region coupled to said first photonic device in a light transmission direction, and removing the first mask,
   e) epitaxially growing a cladding layer at least on top of the first set of layers and the second set of layers, said cladding layer having a dopant of a second type, opposite to said first type,
   f) epitaxially growing a contact layer on top of the cladding layer, and
   g) arranging a first and a second metal contact, being separated, on top of the contact layer, said first metal contact being arranged above said first set of layers and said second metal contact being arranged above said second set of layers,
      wherein the forming or the first photonic device into a mesa structure include using the first mask to form a mesa structure without an adjacently arranged second set of layers other than in the light transmission direction, and the method comprises the additional steps prior to step g):
   f1) applying a second mask on the contact layer, covering at least a part of said first set of layers and at least a part of said second set of layers,
   f2) etching the contact layer and at least a part of the cladding layer, in the unmasked areas,
   f3) and applying an insulating material in the areas not covered with the second mask.

2. The method according to claim 1, wherein the method further comprises the additional steps prior to step e):
   d1) epitaxially growing a thin layer having a dopant of the second type on and around the first set of layers and the second set of layers,
   d2) and epitaxially growing an etch stop layer on top of the thin layer grown in step d1), whereby the etching in step f2) is stopped by the etch stop layer grown in step d2).

3. The method according to any of claim 1, wherein said semiconductor material is an epitaxially grown layer on top of a substrate.

4. The method according to claim 3, wherein said substrate is a semi-insulating substrate, or a semiconductor substrate having a dopant of the first or the second type.

5. The method according to claim 1, wherein said semiconductor material is a semiconductor substrate.

6. The method according to claim 1, wherein said first photonic device is selected to be any of the group: laser, detector and amplifier.

7. The method according to claim 1, wherein said second photonic device is selected to be a modulator.

8. The method according to claim 1, wherein the second mask is a metal mask, preferably made from Titanium.

9. The method according to claim 1, wherein said insulating material is selected to be a planarizable material, preferably a polymer.

10. The method according to claim 1, wherein said forming of the first photonic device into a mesa structure including the use of the first mask to form a mesa structure without an adjacently arranged second set of layers other than in the light transmission direction also include removing some of the first set of layers.

11. The method according to claim 1, wherein the method comprises the additional steps of:
   modifying step d) to include using the first mask to remove said second set of layers in an area adjacent to the second photonic device, to form a window region in the light transmission direction of said first and second photonic device,
   and modifying step e) to include growing the cladding layer in the window region.

12. The method according to claim 11, wherein the width of the part of said second mask used for masking said window region is larger further from the second set of layers compared to the width of the part closest to the second set of layers.

13. The method according to claim 12, wherein said window region masking part is selected to have a tapered shape.

14. A device including a first photonic device optically connected to a second photonic device comprising:
- a first set of epitaxially grown layers, including at least a first waveguide layer, formed in a mesa structure on top of a semiconductor material having a dopant of a first type,
- a second set of epitaxially grown layers, including at least a second waveguide layer, formed in a second photonic device region being coupled to said first photonic device in a light transmission direction, on top of the semiconductor material,
- a cladding layer having a dopant of a second type, opposite to said first type, arranged on top of the mesa structure, the second photonic device region and the surrounding semiconductor material,
- a contact layer arranged on top of the cladding layer, and
- a first and a second metal contact, separately arranged on top of the contact layer, said first metal contact being arranged above said first set of layers and said second metal contact being arranged above said second set of layers,
- wherein said first set of layers is shaped into a mesa structure in an etching process to remove any adjacently arranged second set of layers in the non-light transmission direction, and said cladding and contact layers are shaped in an etching process to have a first contact mesa structure at least above the mesa structure and a second contact mesa structure at least above the second photonic device region, the device further comprising:
- an insulating material applied around the not etched cladding and contact layer.

15. The device according to claim 14, wherein a thin layer having a dopant of the second type is arranged on and around the mesa structure and the second photonic device region, and an etch stop layer is arranged on top of the thin layer, whereby the etching of the cladding and contact layer, to shape the first contact mesa structure and the second contact mesa structure, is stopped by the etch stop layer.

16. The device according to claim 14, wherein said first photonic device is any of the group: laser, detector and amplifier.

17. The device according to claim 14, wherein said second photonic device is a modulator.

18. The device according to claim 14, wherein said semiconductor material is an epitaxially grown layer on top of a substrate.

19. The device according to claim 18, wherein said substrate is a semi-insulating substrate, or a semiconductor substrate having a dopant of the first or the second type.

20. The device according to claim 14, wherein said semiconductor material is a semiconductor substrate.

21. The device according to claim 14, wherein a window region is provided in the cladding layer arranged adjacent to said second contact mesa structure in the light transmission direction.

22. The device according to claim 21, wherein the width of said window region is larger further from the second contact mesa structure compared to the width of the part closest to the second contact mesa structure.

23. The device according to claim 14, wherein the first set of layers is shaped into a mesa structure by also removing some of the first set of layers in the non-light transmission direction.

* * * * *

UNITED STATES PATENT AND TRADEMARK OFFICE
CERTIFICATE OF CORRECTION

PATENT NO. : 7,279,109 B2  Page 1 of 2
APPLICATION NO. : 10/506562
DATED : October 9, 2007
INVENTOR(S) : Stoltz et al.

It is certified that error appears in the above-identified patent and that said Letters Patent is hereby corrected as shown below:

Title Page
Item (30) Foreign Application Priority Data, change "0200751" to --0200751.6--

Column 1
Line 16, change "uses" to --use--
Line 32, change "(EA)" to --(EA).--

Column 2
Line 2, change "mate" to --may--
Line 4, change "has" to --have--

Column 3
Line 12, remove "2O"
Line 35, change "layer,8" to --layer 8--
Line 54, change "is" to --are--
Line 57, change "laser" to --the laser--

Column 4
Line 1, change "is" to --are--
Line 5, change "laser" to --the laser--
Line 10, change "illustrates" to --illustrate--
Line 22, change "4a ." to --4a.--

Column 5
Line 39, change "InP 54" to --InP layer 54--

Column 6
Line 58, change "contact layer 7" to --contact layer 8--
Line 59, change "layer could" to --layer 8 could--
Line 61, change "contact layer 7" to --cladding layer 7--

Signed and Sealed this

Twenty-seventh Day of July, 2010

David J. Kappos
*Director of the United States Patent and Trademark Office*

Column 7
Line 4, change "or" to --of--

Column 8
Claim 1, line 8, change "or" to --of--
Claim 1, line 9, change "include" to --includes--
Claim 10, line 52, change "include" to --includes--